US008036022B2

(12) United States Patent
Anderson et al.

(10) Patent No.: US 8,036,022 B2
(45) Date of Patent: Oct. 11, 2011

(54) STRUCTURE AND METHOD OF USING ASYMMETRIC JUNCTION ENGINEERED SRAM PASS GATES, AND DESIGN STRUCTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 12/190,067

(22) Filed: Aug. 12, 2008

(65) Prior Publication Data
US 2010/0039854 A1    Feb. 18, 2010

(51) Int. Cl.
*G11C 11/00* (2006.01)
(52) U.S. Cl. .................................. 365/154; 365/189.18
(58) Field of Classification Search .................. 365/154, 365/189.18; 257/345
See application file for complete search history.

(56) References Cited

U.S. PATENT DOCUMENTS

| 5,789,781 | A | 8/1998 | McKitterick |
| 6,121,093 | A | 9/2000 | Cheng et al. |
| 6,156,589 | A | 12/2000 | Noble |
| 6,171,913 | B1 | 1/2001 | Wang et al. |
| 6,339,005 | B1 | 1/2002 | Bryant et al. |
| 6,341,083 | B1 | 1/2002 | Wong |
| 6,380,045 | B1 | 4/2002 | Guo |
| 6,396,103 | B1 | 5/2002 | Riccobene et al. |
| 6,466,489 | B1 | 10/2002 | Ieong et al. |
| 6,479,868 | B1 | 11/2002 | An et al. |
| 6,489,224 | B1 | 12/2002 | Burr |
| 6,501,295 | B1 | 12/2002 | Burr |
| 6,528,846 | B1 | 3/2003 | Nowak et al. |
| 6,872,640 | B1 | 3/2005 | Mouli |
| 7,064,019 | B2 | 6/2006 | Fried et al. |
| 7,064,022 | B1 | 6/2006 | Hill et al. |
| 7,166,904 | B2 | 1/2007 | Gill et al. |
| 7,208,397 | B2 | 4/2007 | Feudel et al. |
| 7,301,835 | B2 | 11/2007 | Joshi et al. |
| 7,307,905 | B2 | 12/2007 | Najm et al. |
| 7,362,606 | B2 | 4/2008 | Chuang et al. |
| 7,405,994 | B2 * | 7/2008 | Liaw ........................ 365/230.05 |
| 7,561,483 | B2 | 7/2009 | Joshi et al. |
| 2007/0065999 | A1 | 3/2007 | Lee et al. |
| 2007/0069290 | A1 * | 3/2007 | Houston et al. ............... 257/345 |
| 2007/0290192 | A1 | 12/2007 | Rotondaro |

(Continued)

FOREIGN PATENT DOCUMENTS
JP    55165673    12/1980

OTHER PUBLICATIONS

Notice of Allowance for corresponding U.S. Appl. No. 12/190,040.

(Continued)

*Primary Examiner* — Son Dinh
(74) *Attorney, Agent, or Firm* — Richard Kotulak; Roberts Mlotkowski Safran & Cole, P.C.

(57) ABSTRACT

A design structure, structure and method of using and/or manufacturing structures having asymmetric junction engineered SRAM pass gates is provided. The structure includes an SRAM cell having asymmetric junction-engineered SRAM pass gates with a high leakage junction and a low leakage junction. The asymmetric junction-engineered SRAM pass gates are connected between an internal node and a bit-line node. The high leakage junction is from a body to the internal node and the low leakage junction is from the body to the bit-line node.

23 Claims, 4 Drawing Sheets

U.S. PATENT DOCUMENTS

2009/0032845 A1* 2/2009 Zhu et al. .................. 257/192
2009/0073758 A1 3/2009 Freeman et al.
2010/0039854 A1 2/2010 Anderson et al.

OTHER PUBLICATIONS

Jang et al., "Enhancement of data retention time in DRAM using step gated asymmetric (STAR) cell transistors", Proceedings of ESSERC 2005, $31^{st}$ European Solid-State Device Research Conference, pp. 189-192.

Chidambarrao et al., "Super-halo asymmetric vertical pass transistor design for ultra-dense DRAM technologies", 2003 International Symposium on VLSI Technology, Systems and Applications, Proceedings of Technical Papers, pp. 25-28.

* cited by examiner

RX: ACTIVE SILICON
NW: N+ DEEP WELL
PC: POLYSILICON
CA: CONTACT

CONVENTIONAL 6-T SRAM CELL  1.35 X 1.96 = 2.65 μm²
0.13μm CMOS, beta = 2

STRUCTURE AND METHOD OF USING ASYMMETRIC JUNCTION ENGINEERED SRAM PASS GATES, AND DESIGN STRUCTURE

CROSS REFERENCE TO RELATED APPLICATIONS

This application is related to U.S. Pat. No. 7,791,928 filed on the same day and currently pending.

FIELD OF THE INVENTION

The invention relates to integrated circuits, and more particularly, to design structures, structures and methods of using and/or manufacturing structures having asymmetric junction engineered SRAM pass gates.

BACKGROUND

Conventional CMOS SRAM cells typically consist of six transistors: two P channel field effect transistors (PFETs) for a pull-up operation, two N channel field effect transistors (NFETs) for pull down, and two NFETs for input/output (i.e., pass gate) access. The two pass gates are symmetric pass gates, having moderate leakage junctions.

As shown in FIG. 1A, P1 and N1 form an inverter which is cross-coupled with another inverter consisting of P2 and N2. NL and NR are the pass gate access devices which control reading from and writing into the cell. The pass gates NL and NR consist of moderate leakage junctions which contribute to the instability of the device, e.g., shorting, etc.

The corresponding layout for the above circuit is shown in FIG. 1B. The two pull-up PFETs P1 and P2 are referenced by numeral 102, the two pull down NFETs N1 and N2 by 111, and the pass gate NFETs NL and NR by 101. For simplicity sake, metal shapes are not shown. In the particular layout, the word line (WL) is shown at first level metal M1 along the X-direction. The bit lines and the GND line are represented at the second level metal M2 along the Y-direction. Line 121 is the left bit line BL; line 122, the right bit line BR; and line 120, the vertical GND bus. The shape referenced by RX represents the active silicon area; PC, the polysilicon; CA, the contact from the first level metal M1 to PC or RX; and NW, the region for the N-well of the P-channel devices.

A conventional SRAM array consists of m rows and n columns of the aforementioned SRAM cells. Cells of the same row share one WL, while cells of the same column share the same bit line pair, consisting of BL and BR. The aforementioned design is used in many SRAMs, including, e.g., 1 Mega-bit memory having, typically, 1024 by 1024 cells.

During standby, all the WLs are at low (i.e., at GND level) and all bit lines are biased to the standby voltage level (of the power supply) Vdd. Thus, the NFET pass gate devices NL and NR of all the cells are shut off. A data bit 1 is maintained with P1 and N2 on, and P2 and N1 off, such that the left cell node CL is at high (i.e., Vdd) while CR is at low (GND). Correspondingly, a data bit 0 is maintained when P2 and N1 are on, and P1 and N2 off, which forces the right cell node CR to high (i.e., Vdd) and the left node CL to GND. During access time, one WL is selected by being switched on (to Vdd) such that half of the PFET pass gate devices along the selected WL are turned on simultaneously. For each cell along the selected WL, one pass gate device is turned on.

During a read access operation, either BL or BR are pulled down from their high (at Vdd) by the cell. BL is pulled down if the cell is at 0, whereas BR is pulled down if the cell is at 1. A bit select multiplexor then steers the selected bit pair(s) to appropriate sense amplifiers to generate the digital signals for the external circuitry requesting the read memory operation. The sense signals developed along the unselected bit columns are ignored. The cells along the selected WL that were not selected are referred to as the half-selected cells.

During a write access operation, the bit select circuitry steers the input data into the selected bit pairs. To write a 1, BL is driven to high (i.e., to Vdd) and BR to low (i.e., to GND), shutting off N1 and P2, while turning on N2 and P1. To write a 0, BL is forced to low and BR to high. Along the unselected bit columns, BL and BR are coupled to Vdd and are gradually pulled down by the half-selected cells, as described in the read operation. Thus, during a read access operation, all the cells along the selected WL are disturbed since one NFET pass gate device of each SRAM cell remains on.

During a write access, all the half-selected cells are similarly disturbed as during the read operation. When a cell is at 0, the left cell node CL is at GND. When WL is raised to high (i.e., Vdd), the pass gate device NL switches on, raising BL to Vdd and pulling the left cell node up. Thus, NL and N1 act as a potential divider at CL between Vdd and GND. To prevent the node CL from rising beyond the threshold voltage of N2, the conductance of N1 must be larger than the conductance of NL. Otherwise, N2 turns on, pulling down the node CR, switching P1 on, and raising the node CL from GND to Vdd. In such an instance, the cell is disturbed from its 0 state to a 1 state.

Thus, the ratio of the conductance of N1 over the conductance of NL is a basic metric to measure the stability of the SRAM. This ratio is referred to by CMOS SRAM designers as beta or beta ratio. It is defined as the ratio of the conductance of the pull down device 111 over the conductance of pass gate device 101.

There is no precise analytical expression for the conductance of the transistors. It is approximately proportional to m (pw/pl), wherein pl is the device channel length; pw, the device channel width and m, the effective carrier mobility. Accordingly, the beta of the cell can be approximated by the ratio of (m*pw/pl) of transistor N1 and (m*pw/pl) of NL. If N1 and NL have the same channel length, then the beta ratio becomes the ratio of the channel width of N1 over the channel width of NL. Depending on the SRAM application, beta ranges from 1.8 to 3. In general, beta needs to be bigger for faster operations.

Referring back to FIG. 1A, the six-transistor (6-T) cell shown has been the basic structure used in SRAM circuit designs, even though it is much larger than, e.g., a 1-T DRAM. Indeed, the cell size ratio between SRAM and DRAM generally exceeds 8. Many attempts have been made in the past to reduce the size of the SRAM cell. However, these attempts are routinely achieved by trade-offs between certain desirable feature characteristics of the 6-T SRAM cell. By way of example, the cell size can be reduced by removing the pull-up P channel FETs. This replacement introduces significant problems when the cell stability degrades and standby power dissipation increases. A cell read operation becomes destructive, and write back provisions must be introduced. As a result, the cycle time increases significantly and the access power becomes unacceptably large. Further, a standby pull-up current must also be provided to retain the cell data. Thus, the standby power becomes very significant.

Besides the SRAM cell size, other considerations such as stability and power dissipation problems are emerging, as a result of technology down scaling. As the cells shrink in size, the cells are more prone to flipping because of cosmic rays and alpha particles. Accordingly, soft errors have dramatically increased with every new generation. Further, the off currents of the FET devices also increase exponentially because of the shortened channels. Thus, the SRAM cells become too hot and too unstable as the technology continues its scaling down progression by reducing the size of the cell with more advanced lithography and fabrication processes.

Accordingly, there exists a need in the art to overcome the deficiencies and limitations described hereinabove.

SUMMARY

In a first aspect of the invention, a structure comprises asymmetrical pass gates positioned respectively between internal nodes and bitline nodes.

In embodiments, the asymmetrical pass gates are two asymmetrical pass gates. The asymmetrical pass gates include a high leakage junction and a low leakage junction. The asymmetrical pass gates are connected between a word line (WL), bit line (BL) associated with the bitline node and the respective internal nodes. The asymmetrical pass gates include a higher leakage junction from a body to a first internal node and a lower leakage junction from the body to a bit-line node. The structure is an SRAM cell. The SRAM cell is a six-device SRAM cell. The SRAM cell includes two pull-up asymmetric pFETs and two pull-down asymmetric nFETs. The two pull-up asymmetric pFETs have a lower leakage junction from a body to the respective internal nodes and a higher leakage junction from the body upwards. The two pull-down asymmetric nFETs have a lower leakage junction from a body to the respective internal nodes and a higher leakage junction from the body downwards. The asymmetrical pass gates operate bi-directionally.

In another aspect of the invention, an SRAM cell comprises asymmetric junction-engineered SRAM pass gates having a high leakage junction and a low leakage junction. The asymmetric junction-engineered SRAM pass gates are connected between an internal node and a bit-line node. The high leakage junction is from a body to the internal node and the low leakage junction is from the body to the bit-line node.

In a further aspect of the invention, a design structure embodied in a machine readable medium is provided for designing, manufacturing, or testing an integrated circuit. The design structure comprises asymmetrical pass gates positioned respectively between internal nodes and bitline nodes.

In a yet another aspect of the invention, the design structure comprises asymmetric junction-engineered SRAM pass gates having a high leakage junction and a low leakage junction. The asymmetric junction-engineered SRAM pass gates are connected between an internal node and a bit-line node. The high leakage junction is from a body to the internal node and the low leakage junction is from the body to the bit-line node.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to design structures, structures and methods of using and/or manufacturing structures having asymmetric junction engineered SRAM pass gates. In embodiments, the structure is an SRAM cell which has two asymmetric nFETs used as pass gates. The pass gates are designed to operate bidirectionally. The asymmetric junction engineered pass gates provide very low leakage SOI logic. For example, in the SRAM cell design of the present invention, BL, ~BL are held at Vdd when not active. This results in low cell leakage on all transistors and eliminates the need for symmetric transistors to maintain leakage. Also, in embodiments, the present invention lowers sensitivity to multiple write/read SOI disturb operations.

In more specific embodiments, the present invention includes a latch comprising an asymmetric I/O FET, wherein the asymmetric I/O FET has a high leakage junction from the body to the internal node and low leakage junction from the body to a bit-line node. The latch can comprise a six-device SRAM cell, with two pull-down asymmetric nFETs and two pull-up asymmetric pFETs, in addition to the two asymmetric I/O nFETs. A low-leakage junction is one in which the leakage current from the source or drain to the body, when the junction is substantially reverse-biased (e.g. a reverse bias voltage equal to the power-supply voltage, typically ~1V) is approximately one-one-hundredth ($\frac{1}{100}$) or less the FET leakage. A high-leakage junction is one in which the leakage current from the source or drain to the body, when the junction is substantially reverse-biased (e.g. a reverse bias voltage equal to the power-supply voltage, typically ~1V) is approximately one-tenth ($\frac{1}{10}$) or more, of the FET leakage. Typical values for a low-leakage junction, normalized to FET channel width, are between 0.1 pA/um to 10 pA/um, while typical leakage values for a high-leakage junction are between 100 pA/um to 1 nA/um.

Figure 1A:
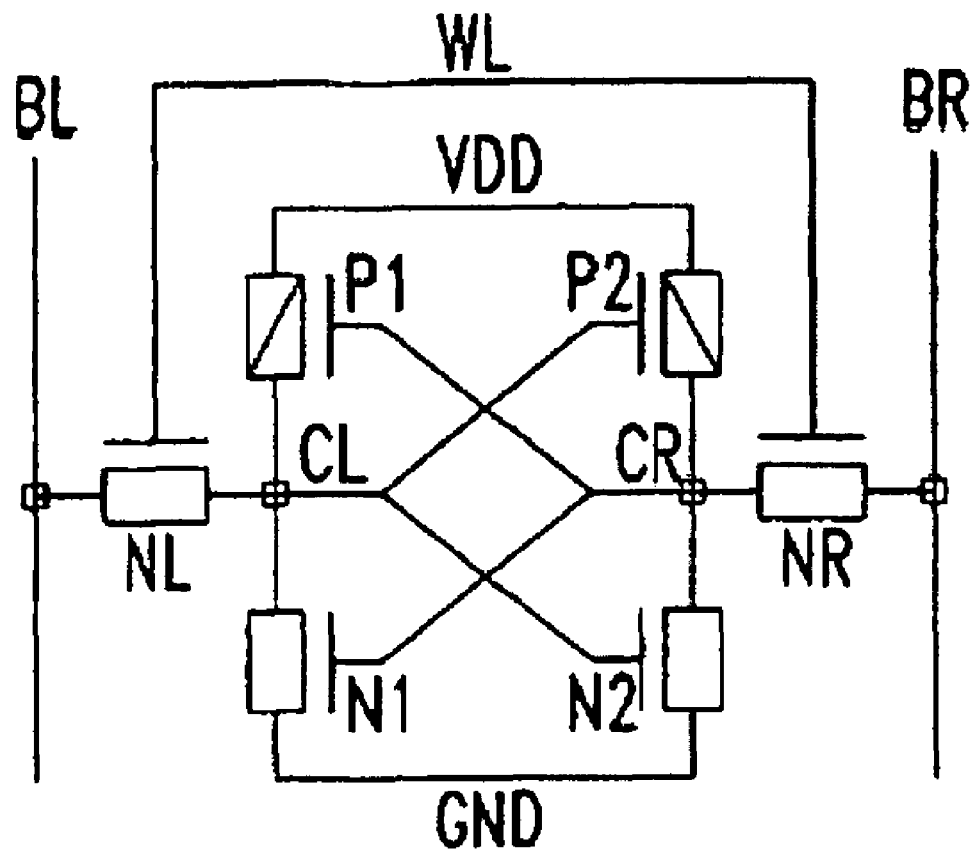
FIGS. 1A and 1B show conventional symmetric pass gate SRAM cells.
Figure 1B:
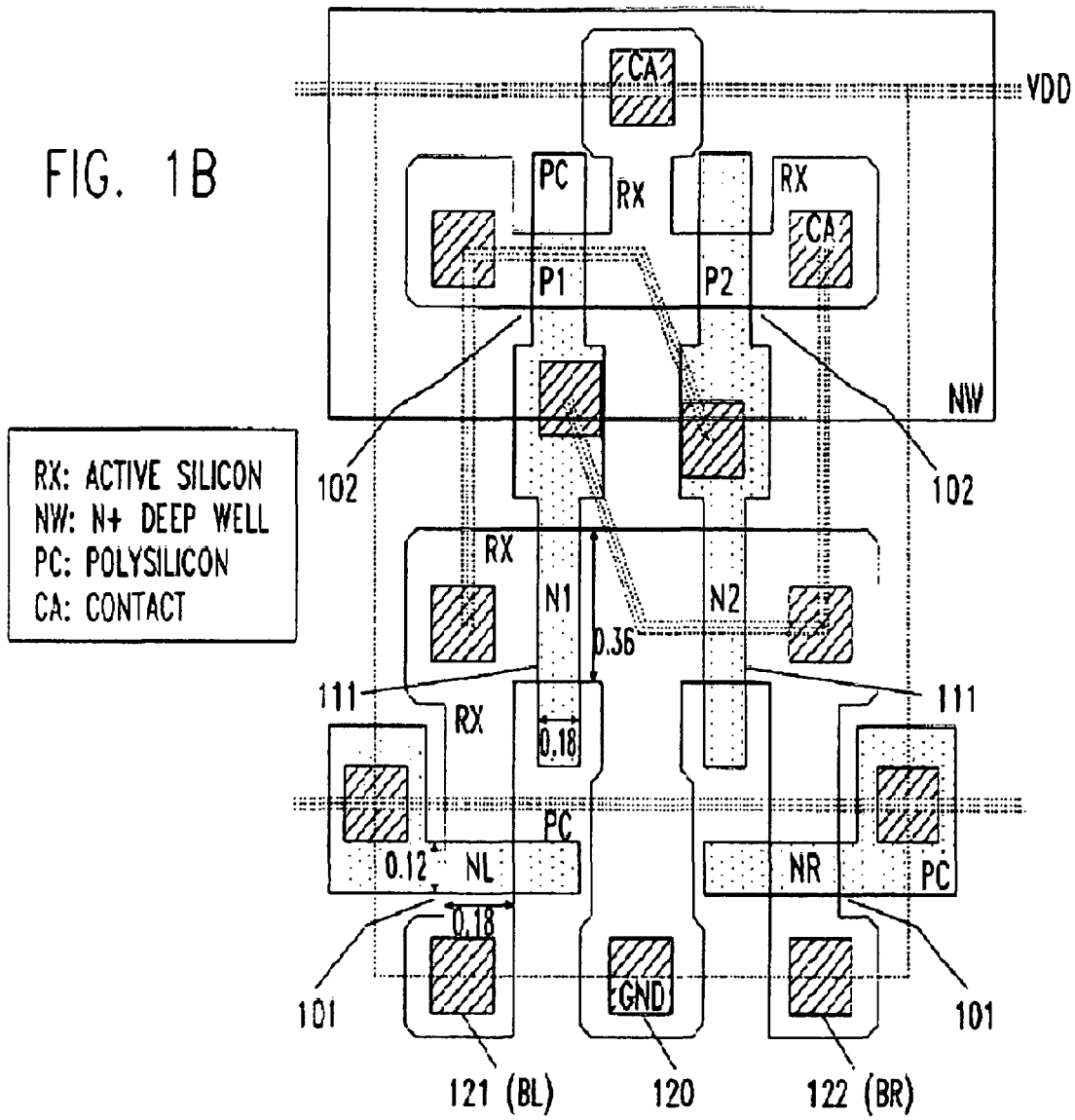
Figure 2:
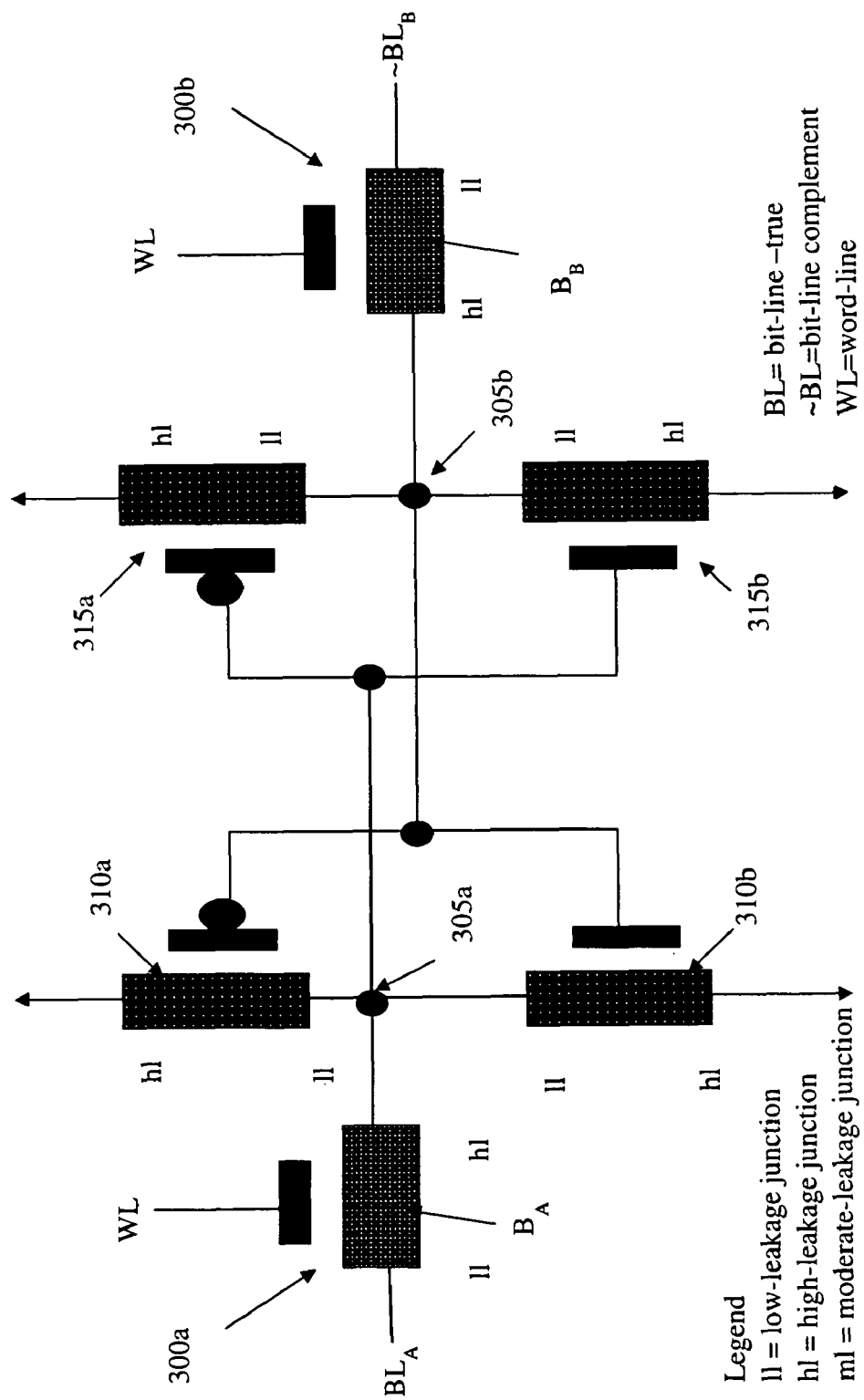
FIG. 2 shows an SRAM cell with asymmetric junction-engineered pass gates in accordance with aspects of the invention.

FIG. 2 shows an SRAM with asymmetric junction-engineered pass gates in accordance with aspects of the invention. More specifically, FIG. 2 shows two asymmetrical pass gates (I/O FET) 300a, 300b connected between a word line (WL), bit line (BL) (or complement bit line (~BL) and internal node 305a, 305b.

As shown in FIG. 2, the asymmetrical pass gates 300a and 300b have a high leakage (hl) junction and a low leakage (ll) junction. More specifically, the asymmetrical pass gate 300a has a high leakage junction from the body ($B_A$) to an internal node 305a and low leakage junction from the body ($B_A$) to a bit-line node, $BL_A$. Similarly, the asymmetrical pass gate 300b has a high leakage junction from the body ($B_B$) to an internal node 305B and low leakage junction from the body ($B_B$) to a bit-line node, $BL_B$ (on the complementary ~BL).

As further shown in FIG. 2, the latch can comprise a six-device SRAM cell, with two pull-up asymmetric pFETs 310a, 315a and two pull-down asymmetric nFETs 310b, 315b, in addition to the pass gates. The two pull-up asymmetric pFETs 310a, 315a have a low leakage junction from the body to the respective internal nodes 305a, 305b and a high leakage junction from the body upwards. On the other hand, the two pull-down asymmetric nFETs 310b, 315b have a low leakage junction from the body to the respective internal nodes 305a, 305b and a high leakage junction from the body downwards.

In operation, there are four states to consider for the SRAM cell. These states include: (i) Passive Data Retention (PDR), (ii) Active Data Retention (ADR), (iii) Data Read (DR), and (iv) Data Write (DW).

In the first case, PDR, data is stored between the two internal nodes. By providing asymmetric pull-down nFETs with high junction leakage from body to the sources (electrically connected to Vss) and low junction leakage from body to drain (electrically connected to the internal true and complement data nodes) and, additionally, asymmetric pull-up pFETs with high junction leakage from body to source (electrically coupled to Vdd) and low junction leakage from body to drain (couple to the internal true and complement data nodes), a superior storage latch is formed. Low drain-to-body leakages result in lower cell leakage while high body-to-source leakages in all four FETs provide for the highest possible device drive for cell speed and stability. Furthermore, in this mode, the bit line with true polarity data (BLT) and bit line with complementary polarity data (BLC) are typically operated at Vdd. In the inventive cell, high junction leakage is provided between the pass-gate bodies and the source/drains electrically connected to the internal data (true and complement) nodes, while low junction leakage is provided between the pass-gate bodies and the bit-line (true and complement) nodes. One pass-gate will remain coupled to a high data node (i.e. Vdata=Vdd) and the other to a low data state (i.e. Vdata=Vss).

The pass-gate in the former state will have low net leakage since the reverse-biased junction is at the bit-line and hence of low leakage, while the latter pass-gate will always have high junction leakage since its high-leakage junction is in reverse bias, and the wordline is held low (e.g., Vwl=Vss). Thus, the sum of the two leakages will be present in each cell. In an alternate embodiment, the BLT and BLC nodes can be held at Vdd/2, and since junction leakage is exponentially dependent on voltage, a substantially lower total cell leakage results.

In the second, ADR, the above discussion regarding the pull-up and pull-down FETs applies identically, however, the BLT and BLC will be dynamically changing in voltage between Vss and Vdd, with the BLC voltage the complement of the BLT (e.g., when BTL is at Vdd, BLC is at Vss, and vice-versa), and the word-line is held low (i.e., Vwl=Vss). This case is similar in that the pass-gates are nearly always biased with one high-leakage and one low-leakage junction resulting in the total power.

In the third case, DR, the pull-down an pull-up devices are again as described in the first and second cases. A read is prepared by first setting BLT and BLC to Vdd (by circuitry external to the array) followed by a gradual (at a rate on the order of 1V/ns) increase of the wordline from Vss to Vdd. The pass-gate tied to a node at Vdd will not turn on since Vgs is always less than Vt, and the leakage through the FET will be low because there is no reverse-biased junction in that pass-gate (since Vds=0). The other pass-gate, tied to a node at Vss, will begin to conduct when Vwl exceeds Vt of the pass-gate and will have relatively high Vt because the high junction leakage between the body and data node will keep the body biased close to Vss. Thus additional cell stability is assured during a read.

In the fourth case, DW, the non-trivial case to consider is one where a cell starts in a first PDR state (first case supra), for example, with the data node at Vdd and the data-complement node at Vss, and one writes the cell to the opposite state, i.e. to the data node at Vss and data-complement node at Vdd. In this case (and specific example) the BLT node is set to Vss (opposite the internal data node) and the BLC node to Vdd. The wordline is increased from Vss to Vdd with time (typically in a time period of about 1 ns). The BLT pass-gate will have a lower Vt than that of the BLC pass-gate, since the high-leakage junction at the data node will result in a more positive body voltage than that in the BLC pass-gate. Thus a strong write signal is present on the true node to write the new data state.

Design Structure

Figure 3:
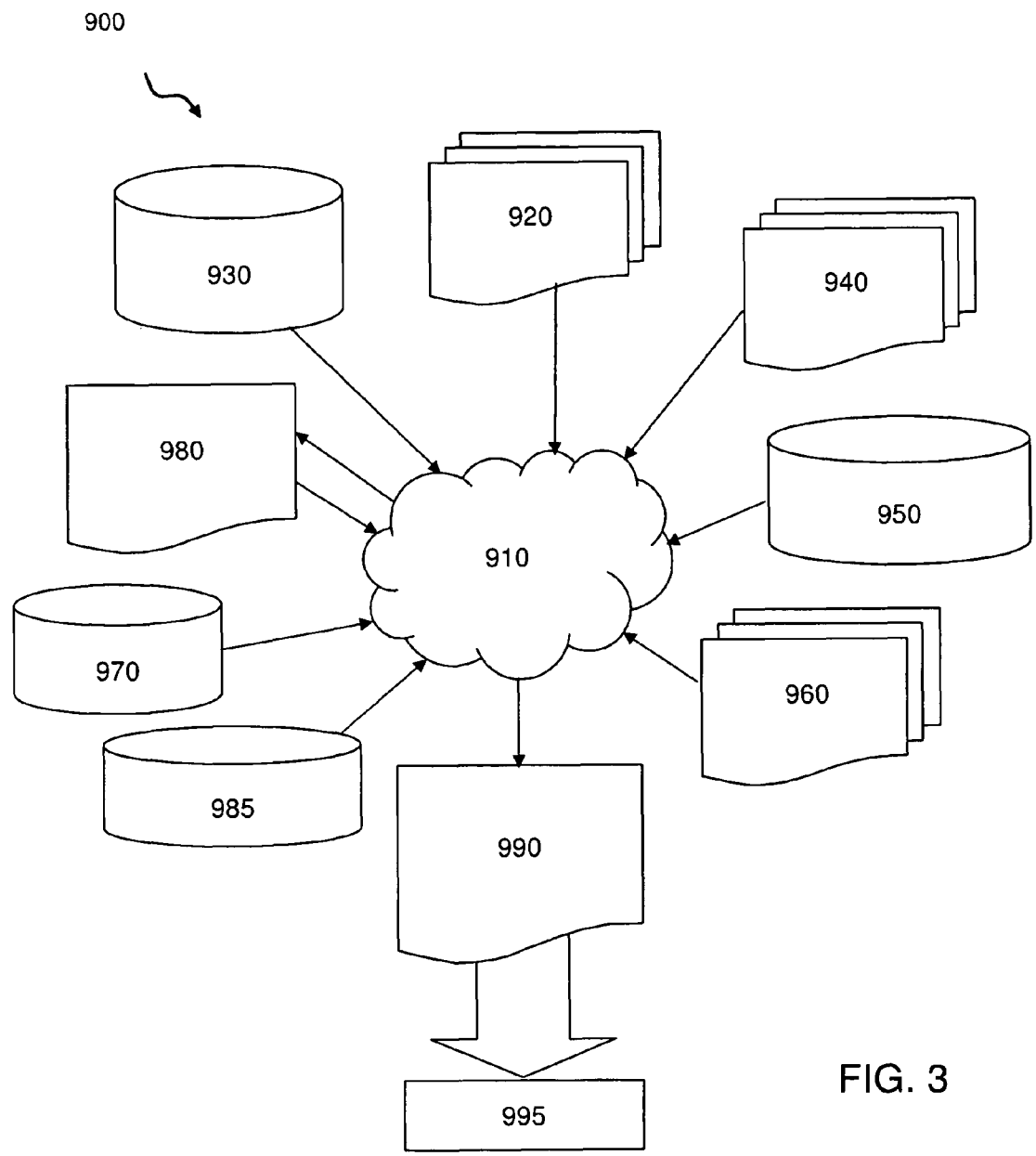
FIG. 3 is a flow diagram of a design process used in semiconductor design, manufacture, and/or test.

FIG. 3 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIG. 2. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2. In one embodiment, design structure 990 may comprise a compiled, executable HDL simulation model that functionally simulates the devices shown in FIG. 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIG. 2. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising asymmetrical pass gates positioned respectively between internal nodes and bitline nodes, wherein the asymmetrical pass gates include a higher leakage junction from a body to a first internal node and a lower leakage junction from the body to a bit-line node.

2. The structure of claim 1, wherein the asymmetrical pass gates are two asymmetrical pass gates.

3. The structure of claim 1, wherein the asymmetrical pass gates include a high leakage junction and a low leakage junction.

4. The structure of claim 1, wherein the asymmetrical pass gates are connected between a word line, bit line associated with the bitline node and the respective internal nodes.

5. The structure of claim 1, wherein the structure is an SRAM cell.

6. The structure of claim 5, wherein the SRAM cell is a six-device SRAM cell.

7. A structure comprising asymmetrical pass gates positioned respectively between internal nodes and bitline nodes, wherein the structure is a six-device SRAM cell which includes two pull-up asymmetric pFETs and two pull-down asymmetric nFETs.

8. The structure of claim 7, wherein the two pull-up asymmetric pFETs have a lower leakage junction from a body to the respective internal nodes and a higher leakage junction from the body upwards.

9. The structure of claim 7, wherein the two pull-down asymmetric nFETs have a lower leakage junction from a body to the respective internal nodes and a higher leakage junction from the body downwards.

10. The structure of claim 1, wherein the asymmetrical pass gates operate bi-directionally.

11. An SRAM cell comprising asymmetric junction-engineered SRAM pass gates having a high leakage junction and a low leakage junction, the asymmetric junction-engineered SRAM pass gates being connected between an internal node and a bit-line node, wherein the high leakage junction is from a body to the internal node and the low leakage junction is from the body to the bit-line node.

12. The SRAM cell of claim 11, wherein the asymmetric junction engineered SRAM pass gates operate bi-directionally.

13. The SRAM cell of claim 11, further comprising asymmetric nFETs and asymmetric pFETs.

14. The SRAM cell of claim 11, wherein the asymmetric nFETs are two pull-down asymmetric nFETs and the asymmetric pFETs are two pull-up asymmetric pFETs.

15. The SRAM cell of claim 11, wherein the asymmetric junction-engineered SRAM pass gates provide low leakage SOI logic.

16. The SRAM cell of claim 11, wherein the asymmetric junction-engineered SRAM pass gates hold BL, ~BL at Vdd when not active.

17. The SRAM cell of claim 11, wherein the asymmetric junction-engineered SRAM pass gates eliminate a need for symmetric transistors to maintain leakage.

18. The SRAM cell of claim 11, wherein the asymmetric junction-engineered SRAM pass gates lower sensitivity to multiple write/read SOI disturb operations.

19. A design structure embodied in a machine readable medium for designing, manufacturing, or testing an integrated circuit, the design structure comprising asymmetrical pass gates positioned respectively between internal nodes and bitline nodes, wherein the asymmetrical pass gates include a higher leakage junction from a body to a first internal node and a lower leakage junction from the body to a bit-line node.

20. The design structure of claim 19, wherein the design structure comprises a netlist.

21. The design structure of claim 19, wherein the design structure resides on storage medium as a data format used for the exchange of layout data of integrated circuits.

22. The design structure of claim 19, wherein the design structure resides in a programmable gate array.

23. A design structure embodied in a machine readable medium for designing, manufacturing, or testing an integrated circuit, the design structure comprising asymmetric junction-engineered SRAM pass gates having a high leakage junction and a low leakage junction, the asymmetric junction-engineered SRAM pass gates being connected between an internal node and a bit-line node, wherein the high leakage junction is from a body to the internal node and the low leakage junction is from the body to the bit-line node.

* * * * *